United States Patent [19]
Ariizumi et al.

[11] 4,399,520
[45] Aug. 16, 1983

[54] SEMICONDUCTOR INTEGRATED CIRCUIT DEVICE

[75] Inventors: Shoji Ariizumi, Tokyo; Makoto Segawa, Yokohama; Hisaaki Maiwa, Kawasaki; Seishi Okamoto, Yokohama, all of Japan

[73] Assignee: Tokyo Shibaura Denki Kabushiki Kaisha, Kawasaki, Japan

[21] Appl. No.: 235,859

[22] Filed: Feb. 19, 1981

[30] Foreign Application Priority Data

Feb. 22, 1980 [JP] Japan .................................. 55-21203
Jun. 27, 1980 [JP] Japan .................................. 55-87335

[51] Int. Cl.³ .............................................. G11C 7/00
[52] U.S. Cl. .................................... 365/174; 365/211; 365/51
[58] Field of Search ............... 365/149, 174, 206, 211, 365/212, 244, 51; 357/45, 51, 52

[56] References Cited

U.S. PATENT DOCUMENTS 4,163,245 7/1979 Kinoshita .............................. 357/51

Primary Examiner—Joseph A. Popek
Attorney, Agent, or Firm—Cushman, Darby & Cushman

[57] ABSTRACT

A semiconductor integrated circuit having a memory and an adjacent peripheral circuit generating minority carriers which can destroy data in a portion of the memory at low temperatures. The load resistance in the portion is made lower or the storage capacity is made higher in the portion than in the remainder of the memory so that at low temperatures data is not lost and the energy consumption of the circuit is not unduly increased.

3 Claims, 9 Drawing Figures

SEMICONDUCTOR INTEGRATED CIRCUIT DEVICE

BACKGROUND OF THE INVENTION

This invention relates to an improved semiconductor integrated circuit reducing the adverse influences of minority carriers.

Recently, semiconductor technology for manufacturing integrated circuits has advanced in that memory size of one-chip memory has been substantially enlarged. FIG. 1 illustrates a conventional memory cell circuit of N-type channel MOS static random access memory (RAM). This memory is composed of a flip-flop circuit constructed of a pair of inverter circuits 5 and 6 and a pair of transmitting transistors 9 and 10 connected to data lines 7 and 8 respectively. Inverter circuits 5 and 6 have driving transistors 1 and 2 and load resistors 3 and 4 respectively. Load resistors 3 and 4 are preferably made by high resistance polycrystalline silicon. This type RAM is called a four transistor and two resistor RAM. The values of load resistors 3 and 4 are produced by ion implantation in which the impurity is injected into the undoped polycrystalline silicon layer. The value of resistors 3 and 4 has a minus gradient characteristic with change of temperature so that resistance becomes low at elevated temperatures. The increasing supply current of the load resistor compensates the leakage current of the PN junction.

Load resistors 3 and 4 are ordinarily in the range several $M\Omega$ to several hundred $M\Omega$ at high temperatures. However, the value of load resistors 3 and 4 extremely increases into the $G\Omega$ ($10^3$ $M\Omega$) range at low temperatures. When the RAM is operated at low temperature, the leakage current of the PN junction decreases at a rate much greater than the rate of resistance increase. For example, when temperature goes down from 100° C. to 25° C., the leakage current decreases by 3 to 4 orders of magnitude, but the value of the resistors increases no more than two. Consequently, load resistors 3 and 4 have sufficiently performed to retain the data.

However, when the value of load resistors 3 and 4 becomes extremely high, these resistors are apt to be affected by the minority carriers produced from peripheral circuits other than memory. In addition, the lower the temperature, the longer the lifetime of the minority carriers so that their influence on memory is stronger. FIG. 2 illustrates the consequence of the minority carriers of a RAM composed of N-type channel transistors. Transistor T (shown by dotted line) is a element of peripheral circuits, for example, an input circuit and a self-substrate biasing circuit, etc. Minority carriers (electrons) 11 generated at N+ region 12 inject into P-type substrate 13 and reach another N+-type region 14 which is a part of the memory stored "1" level. Minority carriers 11 recombine with holes in N+-type region 14, thereby the "1" level loses a portion of carriers. In the worst case, the "1" level is broken by the minority carriers. This phenomenon is apt to result at lower temperatures with high values of resistors 3 and 4 (shown in FIG. 1). Therefore, it is desirable to lower the value of resistors 3 and 4 to prevent the outbreak of this phenomenon. However, if the value of the resistors of all memory is lowered, the electric power consumption of all of the RAM grows.

FIG. 3 illustrates another memory which consists of data storage capacity $C_1$, data transmitting MOS transistor $Q_1$, word line W, data line D and parasitic capacity $C_{ST}$ associated with data line D. In this type memory, writing of the data is performed by transmitting the electrical potential level at data line D to capacity $C_1$, through transistor $Q_1$ selected by word line W. Reading of the data is performed by sensing the electric potential level $V_1$ as the stored data in capacity $C_1$ through transistor $Q_1$ selected by word line W.

However, the minority carriers can destroy the stored data of above-mentioned memory as shown in the FIG. 3. FIG. 4 illustrates the influence of the minority carriers, and similar elements in FIG. 3 are assigned the same reference numbers as above.

Transistor $Q_1$ consists of a gate electrode 41 made of poly-crystalline silicon and two N+-type regions 42 and 43. Capacity $C_1$ is constructed as the sum of capacities $C_{11}$ and $C_{12}$. Capacity $C_{12}$ is formed between capacitor electrode 44 and reverse layer 45 produced on the surface of P-type substrate 46 at applying bias $V_{cc}$. Capacity $C_{11}$ is a PN junction capacity. Minority carriers are electrons 47 and are generated from N+-type region 48 of a peripheral circuit. If the minority carriers reach the memory cell, these carriers jump into the data storage mode of the memory and recombine with holes. The "1" level drops corresponding to the quantity of the minority carriers. When the minority carriers are too many, the "1" level is lost and the data destroyed. This phenomenon becomes more common at the lower temperatures in which lifetime and mobility of the minority carriers is increased.

A guard ring structure is known to improve the above-mentioned fault, for example, in U.S. Pat. No. 4,163,245. Namely, N+-type guard ring region 49 shown in FIG. 4 is provided around the memory and is connected to an electric source. Such region cannot perfectly guard the memory cells from minority carriers which pass through the deeper portion of substrate 46. A radical counter-measure is to enlarge the storage mode capacity $C_1$ of the memory. However, this structure hinders increasing storage capacity.

OBJECT AND SUMMARY OF THE INVENTION

An object of this invention is to provide an improved semiconductor integrated circuit with decreased electric power consumption and with established high density integration.

The semiconductor integrated circuit device according to this invention comprises a group of memories structured not to be influenced by minority carriers. More particularly, load resistance in portions of the memory which can be adversely affected by minority carriers from adjacent peripheral circuits at low temperatures is reduced or storage capacitance increased in comparison to resistance and capacitance in the rest of the memory so the influence is reduced without unduly increasing power consumption.

BRIEF DESCRIPTION OF THE DRAWINGS

This and other objects and advantages of the invention will become more apparent and more readily appreciated from the following detailed description of the presently referenced exemplary embodiment of the invention taken in conjunction with the accompanying drawings, of which.

DETAILED DESCRIPTION OF THE PREFERRED EMBODIMENTS

Figure 1:
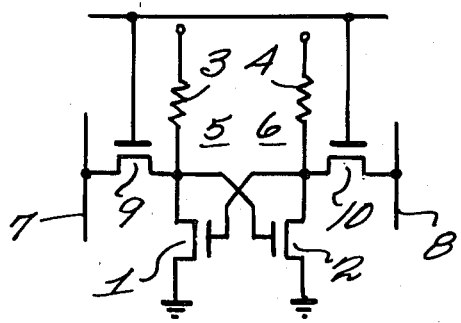
FIGS. 1 and 3 are circuit diagrams of conventional semiconductor memory.
Figure 2:
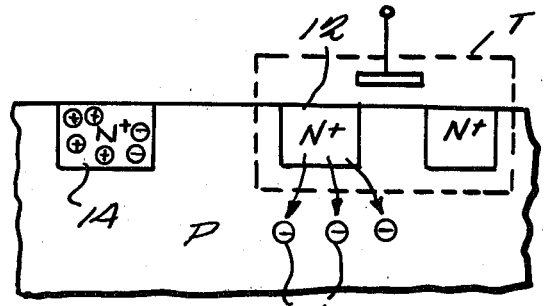
FIGS. 2 and 4 are sectional views of conventional semiconductor memory to illustrate a consequence of the minority carriers.
Figure 5:
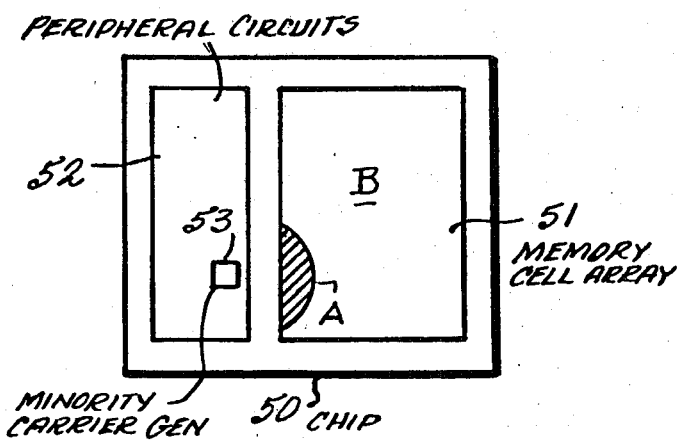
FIGS. 5 and 6 are schematic plan views of embodiments of this invention.

FIG. 5 illustrates a schematic plan view of a memory device having the memory cells shown in FIG. 1. Chip 50 is composed of memory cell array part 51 and peripheral circuits part 52 including part 53 generating minority carriers for example an input circuit and a self substrate biasing circuit, etc. Since an oblique line region A into memory part 51 is near part 53, the minority carriers can reach oblique line region A. Now, the values of resistors 3 and 4 (shown in FIG. 1) of memory in region A are equal and set to $R_1$. A non-oblique line region B is located far from part 53, and is the region in which the minority carriers do not reach or at least do not influence region B. The values of resistors 3 and 4 (shown in FIG. 1) of the memories in region B are equal and set to $R_2$, and the relation $R_1$ $R_2$ is established between resistors of both regions A and B.

Since the value of resistors as the load element only in region A has been established lower than in region B, the destruction of data is prevented. Moreover, use of polycrystalline silicon as the load elements harms high integration. This improvement is accompanied by little increase of electric power consumption since region A is much smaller than region B. When the memory has a capacity of 1 K bits or 2 K bits, the area of region A is one-tenth of the total, for a 16 K or 64 K bits memory the ratio is one to several hundreds.

A method to reduce the value of resistors 3 and 4 (shown in FIG. 1) in region A is additional ion implantation using photo engraving process (PEP) because the value of resistors is decided by the quantity of the impurity of ion implantation. If the value of resistors is only decided by the length of polycrystalline silicon layer not including the impurity, a better method is selective ion implantation only in region A. The values can also be varied by designing the pattern of the resistors.

Figure 3:
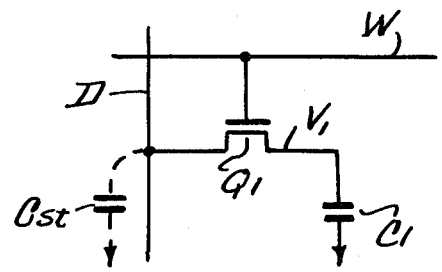
Figure 4:
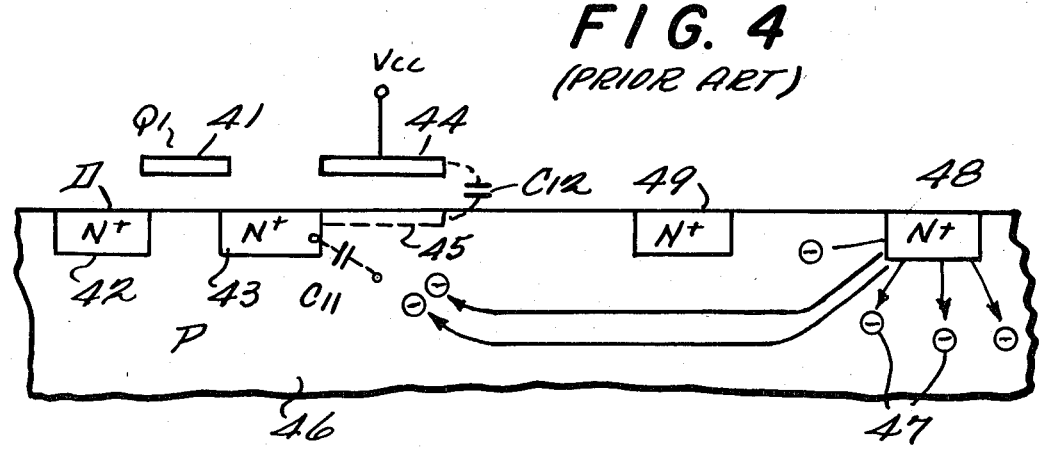
Figure 6:
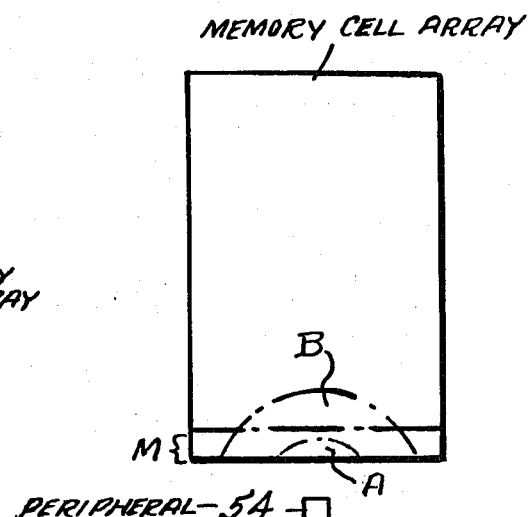

FIG. 6 illustrates a schematic plan view of another embodiment of the invention, especially concerning the memory using the capacitor (shown in FIGS. 3 and 4). In FIG. 6, memories (shown in FIG. 3) in region A are destroyed by the minority carriers generated from peripheral circuit 54, and region B receives the minority carriers but is not sufficiently influenced to data. Therefore, in this embodiment, capacity $C_1$ (shown in FIG. 3) of the memories in region M including at least region A is increased more than in other region's memories. One method to increase the capacity is to enlarge electrode 44 of capacitor $C_1$ (shown in FIGS. 3 and 4).

Figure 7:
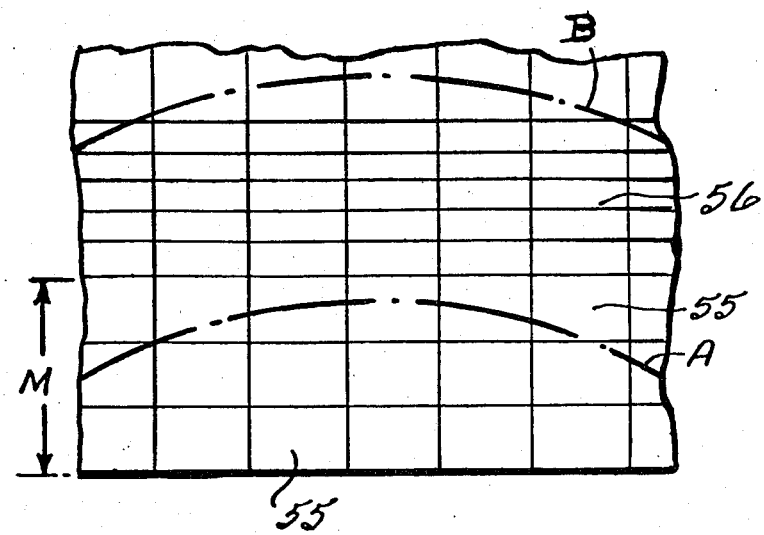
FIG. 7 is a partially enlarged plan view of FIG. 6.

FIG. 7 illustrates an enlarged portion of FIG. 6, memories 55 being in region M including region A are made larger than memories 56 to increase capacity. Region M includes memories except for region A, because of the layout of cells.

Figure 8:
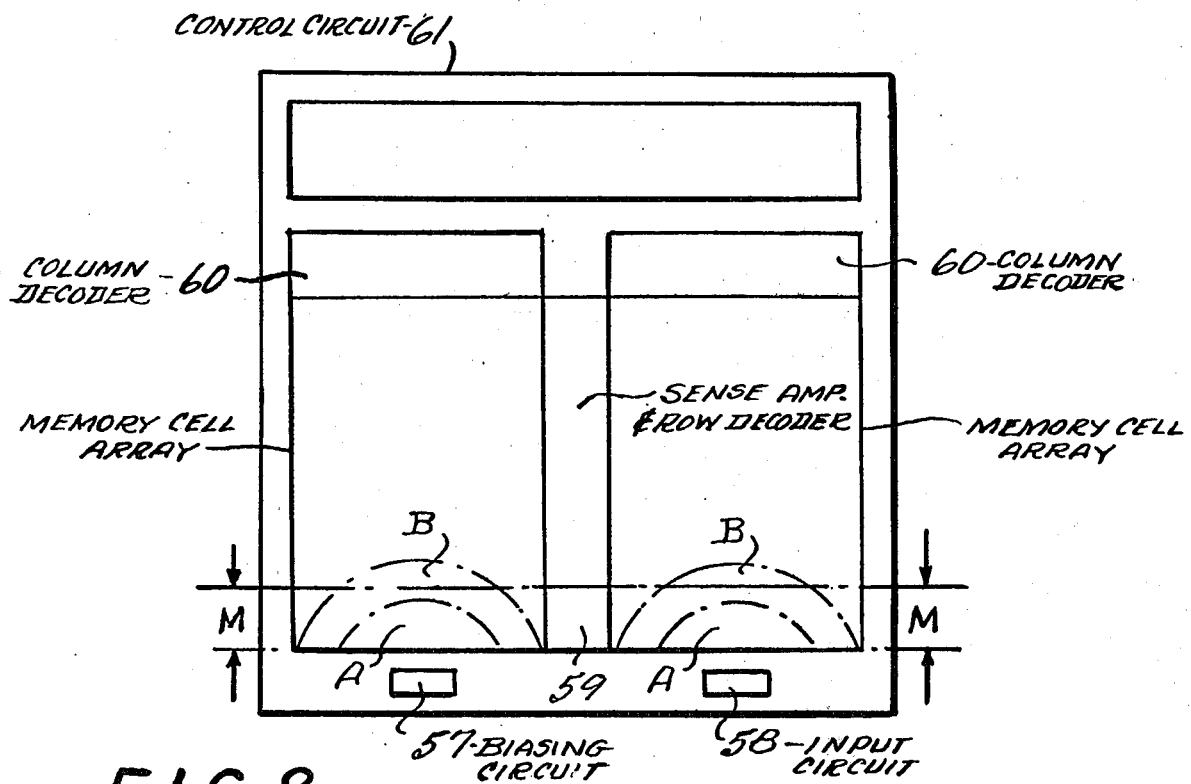
FIG. 8 is a schematic plan view showing structure of FIG. 6.

FIG. 8 illustrates a schematic plan view of a more specific structure of the embodiment of FIG. 6. Similar elements in these FIGURES are assigned the same reference numbers as above. Minority carriers generation circuits are self-substrate biasing circuit 57 and input circuit 58. Sense amplifier and row decoder part 59 is formed between memory parts. Column decoder part 60 and control circuits part 61 including the pulse generator and input-output circuit are formed at another end portion of this chip. The cell sizes in region M are greater than in the rest of the memory. An area of region M is no more than one-tenth or one to several hundreds to a total area of the chip. Therefore, a substantial raise in area is not needed.

Figure 9:
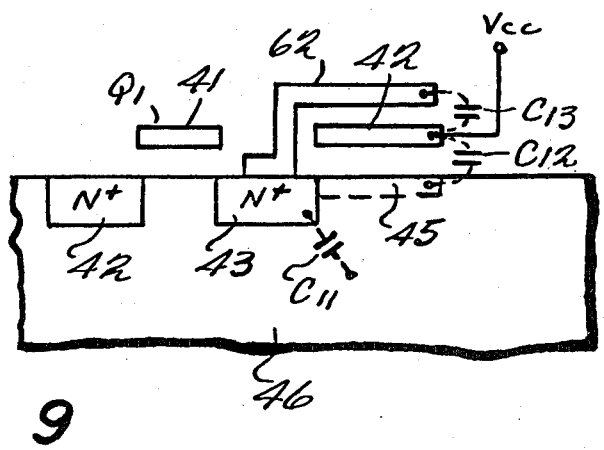
FIG. 9 is a sectional view of an other embodiment of this invention.

FIG. 9 illustrates another embodiment of this invention, especially concerning another structure to enlarge the data storage capacity. Similar elements in FIG. 9 are assigned the same reference numbers as above. In FIG. 9, polycrystalline silicon electrode 62 which is connected to N+-type region 43 is formed on capacitor electrode 42. New capacity $C_{13}$ is formed between electrodes 62 and 42, thereby capacity $C_1$, (shown in FIG. 3) is defined, $C_1 = C_{11} + C_{12} + C_{13}$. As the result of this structure, the data storage capacity has been increased. The problem of minority carriers is solved as described above.

This invention is not limited to the above-mentioned capacity memories, but is applicable to other integrated circuits using data storage, for example, a CCD (charge coupled device) and a dynamic type shift register.

Many changes and modifications can, of course, be carried out without departing from the scope of the present invention, that scope, accordingly, being defined only by the scope of the appended claims.

What is claimed is:

1. A semiconductor integrated circuit having a memory made up of individual elements having associated circuit values and a peripheral circuit generating minority carriers which influence some of the elements making up a portion of said memory wherein said elements are formed so that the values of at least one of said circuit elements are set in said portion different from the values in the remainder of said memory so that the effect of the influence is reduced in said portion so stored data, which would be otherwise lost if the values were the same as in the remainder of the memory, is not lost.

2. A semiconductor integrated circuit device as in claim 1, wherein said elements are resistors and are formed using polycrystalline silicon, and the value of the resistance of each element in said portion is less than the value of the resistance in the remainder of said memory.

3. A semiconductor integrated circuit device as in claim 1, wherein elements are capacitors and are formed to provide storage capacities, and the storage capacities in said portion being more than the storage capacities in the remainder of said memory.

* * * * *